United States Patent
Maier et al.

(10) Patent No.: US 8,094,909 B2
(45) Date of Patent: Jan. 10, 2012

(54) APPARATUS AND METHOD FOR REMOTELY CONTROLLING IN REAL TIME MEASUREMENT PARAMETERS OF A MAGNETIC RESONANCE (MR) SCANNER

(75) Inventors: Corinna Maier, Princeton, NJ (US); Klaus J. Kirchberg, Princeton, NJ (US); Peter Speier, Erlangen (DE); Christine H. Lorenz, Frederick, MD (US)

(73) Assignee: Siemens Aktiengesellschaft, München (DE)

( * ) Notice: Subject to any disclaimer, the term of this patent is extended or adjusted under 35 U.S.C. 154(b) by 242 days.

(21) Appl. No.: 12/207,605

(22) Filed: Sep. 10, 2008

(65) Prior Publication Data

US 2009/0092304 A1  Apr. 9, 2009

Related U.S. Application Data

(60) Provisional application No. 60/978,425, filed on Oct. 9, 2007.

(51) Int. Cl.
*G06K 9/00* (2006.01)
*G01V 3/00* (2006.01)
(52) U.S. Cl. ........ 382/131; 324/307; 324/309; 324/300; 382/128
(58) Field of Classification Search .......... 324/300–322; 382/128–131; 600/410; 705/3; 370/311
See application file for complete search history.

(56) References Cited

U.S. PATENT DOCUMENTS

| 6,157,194 | A | 12/2000 | Vassallo et al. |
| 6,198,285 | B1 | 3/2001 | Kormos et al. |
| 6,801,037 | B1 * | 10/2004 | Zhang ................ 324/309 |
| 7,075,302 | B2 * | 7/2006 | Zhu ...................... 324/309 |
| 7,081,750 | B1 * | 7/2006 | Zhang ................ 324/309 |
| 7,423,429 | B2 * | 9/2008 | Hernandez Perez et al. . 324/309 |
| 2002/0124054 | A1 | 9/2002 | Dorn et al. |
| 2008/0291855 | A1 * | 11/2008 | Bata et al. ................ 370/311 |
| 2009/0092304 | A1 * | 4/2009 | Maier et al. ............. 382/131 |
| 2009/0164253 | A1 * | 6/2009 | Lyshkow ................ 705/3 |

FOREIGN PATENT DOCUMENTS

DE  19625841 A1  1/1998

OTHER PUBLICATIONS

Authors: C. H.Lorenz, K. J. Kirchberg, S. Zuehlsdorff, P. Speier, M. Caylus, W. Borys, T. Moeller , M. A. Guttman; Title: "Interactive Frontend (IFE): A Platform for Graphical MR Scanner Control and Scan Automation," p. 2170; Proc. Intl. Soc. Mag. Reson. Med. 13 (2005).

* cited by examiner

*Primary Examiner* — Melissa Koval
*Assistant Examiner* — Tiffany Fetzner
(74) *Attorney, Agent, or Firm* — Donald B. Paschburg

(57) ABSTRACT

Apparatus for remotely controlling parameters of an image scanning apparatus includes a software interface for translating commands from an external application for providing scanner control commands to a scanner control machine for control of the parameters; and the software interface includes syntax software for translating the commands from the external application into a given syntax for providing the scanner control commands.

17 Claims, 3 Drawing Sheets

APPARATUS AND METHOD FOR REMOTELY CONTROLLING IN REAL TIME MEASUREMENT PARAMETERS OF A MAGNETIC RESONANCE (MR) SCANNER

CROSS-REFERENCE TO RELATED APPLICATION AND CLAIM OF PRIORITY

Specific reference is hereby made to copending U.S. Provisional Patent Application No. 60/978,425, filed Oct. 9, 2007 in the names of inventors CORINNA MAIER, KLAUS J. KIRCHBERG, PETER SPEIER, and CHRISTINE LORENZ and entitled "An apparatus to remotely real time control measurement parameters of an MR scanner", and whereof the disclosure is hereby incorporated herein by reference and whereof the benefit of priority is claimed.

FIELD OF THE INVENTION

The present invention relates generally to the field of imaging apparatus and more particularly to magnetic resonance imaging (MRI) apparatus and control apparatus for such imaging apparatus.

BACKGROUND OF THE INVENTION

Magnetic Resonance Imaging (MRI) is a known technique for obtaining 2-dimensional (2D) and 3-dimensional (3D) images of a patient based upon nuclear magnetic resonance (NMR) principles. MRI is widely used in medicine for the examination and diagnosis of internal medical conditions in a patient. Detailed descriptions of MRI systems are widely available in the literature. Briefly, an MRI system generally includes an electromagnet for producing an intense magnetic field for covering at least a portion of a patient's anatomy. Typically an MRI system also includes a radio frequency field generator, a receiving system coupled to a coil surrounding a portion of the patient's anatomy under study, and a magnetic gradient system to localize in space a particular portion of the patient's anatomy under study. Generally, an MRI system or scanner also includes a computer-based image processing system for receiving signals from the coil and for processing the signals into interpretable data, such as visual images for viewing by a physician or other radiology analyst. Generally, the system includes MR scanner control apparatus for controlling operation and operating and measurement parameters of the system.

Various arrangements including control arrangements are known in the MRI art. For example, U.S. Pat. No. 6,157,194, entitled CONTROL OF MRI SYSTEM and assigned to Fonar Corporation, discloses an arrangement wherein a generic MR Host for controlling multiple types of MPCUs such as a WordProgram (the Host) can communicate with multiple types of printers. Thus, the scanner control in this patent controls a plurality of devices.

In another example, U.S. Pat. No. 6,198,285 entitled IN-ROOM MRI DISPLAY TERMINAL AND REMOTE CONTROL SYSTEM and assigned to Hitachi Medical Corporation, discloses an arrangement for controlling a piece of equipment in an MR room by way of an infrared receiver. In this arrangement, the control path is contained within a room.

It is herein recognized that the foregoing documents, do not contemplated controlling a scanner by multiple types of input applications. Furthermore, at least in the aforementioned U.S. Pat. No. 6,198,285, operation is restricted to within a room. No means are disclosed for controlling scanner parameters remotely.

A prior development was to allow the prototype application Interactive Front End to control a real time measurement on the scanner remotely. See the publication by C. H. Lorenz, K. J. Kirchberg, S. Zuehlsdorff, P. Speier, M. Caylus, W. Borys, T. Moeller, and M. A. Guttman entitled "Interactive Frontend (IFE): A platform for Graphical MR Scanner Control and Scan Automation"; Proc. Intl. Soc. Mag. Reson. Med. 13 (2005); 2170, whereof the disclosure is hereby incorporated herein by reference. Authors Kirchberg, Speier, and Lorenz are also named inventors in the present application for patent.

The MriProtAccess[d].dll uses the OLE Automation, which was used by the Syngo architecture and is disclosed in German patent document No. DE 1962584 to which reference is made for further information. OLE stands for Object Linking and Embedding; this is a Microsoft Corporation software technology that generally allows Windows programs to exchange information and work together. The definition of OLE already includes remote control and this existed in the initial NUMARIS/4 software. NUMARIS is a software package application applicable to MR from Siemens AG, also under the name SYNGO MR.

BRIEF SUMMARY OF THE INVENTION

In accordance with an aspect of the present invention, a scanner is controllable by a plurality of types of input applications.

In accordance with an aspect of the present invention, a scanner is controllable by a plurality of types of inputs applications which may be situated in locations outside the scanner room.

In accordance with an aspect of the invention, apparatus in accordance with the present invention is adapted to remotely control available measurement parameters of an MR scanner.

In accordance with an aspect of the invention, apparatus in accordance with the present invention remotely controls measurement parameters of an MR scanner.

In accordance with an aspect of the invention, apparatus in accordance with the present invention remotely controls at least a portion of the available measurement parameters of an MR scanner.

In accordance with an aspect of the invention, apparatus in accordance with the present invention remotely controls available measurement parameters of an MR scanner by means of an external application.

In accordance with an aspect of the invention, the external application runs on the MR scanner control apparatus.

In accordance with an aspect of the invention, the external application runs on an external personal computer (PC) coupled with the MR scanner control apparatus by the hub of an internal scanner network.

In accordance with an aspect of the invention, the external application runs on at least one of
 (a) the MR scanner control apparatus, and
 (b) an external personal computer (PC) coupled with the MR scanner control apparatus by the hub of an internal scanner network.

In accordance with an aspect of the invention, apparatus in accordance with the present invention is embodied in a single software application.

In accordance with an aspect of the invention, apparatus in accordance with the present invention is adapted for receiving commands from an external application regarding the retrieval, the setting, or manipulation of scan parameters.

In accordance with an aspect of the invention, apparatus in accordance with the present invention utilizes a software interface which is part of the MR scanner control software to translate received commands into a certain syntax in accordance with another aspect of the present invention and into scanner control commands.

In accordance with an aspect of the invention, after a transaction, apparatus in accordance with the present invention sends feedback to a requesting application of the transaction.

In accordance with an aspect of the invention, apparatus in accordance with the present invention provides an interface for an application to modify a protocol on the MR scanner in a generic manner.

In accordance with an aspect of the invention, a method in accordance with the present invention provides for remotely controlling scan parameters without knowledge of the OLE APIs of the Scanner Software and by an application on an external machine. API stands for Application Programming Interface: generally software that an application program uses to request and carry out lower-level services performed by, for example, a computer's operating system.

In accordance with an aspect of the present invention, the invention is adapted to be used by an application which requires updated measurement control parameters. The apparatus and method of the invention include the use of the apparatus and/or the method by an external application.

An object of the present invention is to provide for manipulation of any or all available parameters of an open protocol without restriction to particular parameters.

Still another object of the present invention is that the method and apparatus in accordance with present invention are generally not restricted to particular parameters, but can manipulate available parameters of an open protocol.

In accordance with an aspect of the present invention, apparatus in accordance with the present invention is made available to be used by an external application.

In accordance with an aspect of the present invention, apparatus for remotely controlling parameters of an image scanning apparatus includes a software interface for translating commands from an external application for providing scanner control commands to a scanner control machine for control of the parameters; and the software interface includes syntax software for translating the commands from the external application into a given syntax for providing the scanner control commands.

In accordance with an aspect of the invention, the external application runs on at least one of (a) the scanner control machine, and (b) an external machine, the external machine being coupled to the scanner control machine.

In accordance with an aspect of the invention, the scanner control machine comprises a hub of an internal scanner network; and the external machine is coupled to the scanner control machine by at least one of:(a) the syntax software, and (b) the hub.

In accordance with an aspect of the invention, apparatus for remotely controlling parameters of an image scanning apparatus in real time, comprises: a scanner control machine for control of the parameters, wherein the scanner control machine includes scanner control software for providing the control of the parameters; and an external application for providing commands, the external application running on at least one of: (a) the scanner control machine, and (b) an external machine coupled to the scanner control machine.

In accordance with an aspect of the invention, apparatus for controlling parameters of an image scanning apparatus including a scanner control machine comprises: memory means for storing a program and other data; and processor means in communication with the memory means and being operative with the program to perform: processing commands from an external application by a software interface, the software interface comprising syntax software for translating the commands into a syntax for providing scanner control commands, and supplying the scanner control commands to scanner control software in the scanner control machine for controlling the parameters.

In accordance with an aspect of the invention, a method for remotely controlling parameters of an image scanning apparatus comprises: processing, in a software interface including a user interface, commands from an external application; and wherein the processing comprises a step of translating the commands into a given syntax for providing scanner control commands to a scanner control machine for control of the parameters.

In accordance with an aspect of the invention, a method for controlling parameters of an image scanning apparatus comprises: running a software application for remotely controlling the parameters, including scanner control commands, on at least one of: (a) scanning control apparatus associated with the image scanning apparatus, and (b) a computer external to the image scanning apparatus coupled to the scanning control apparatus; applying the external control commands to the software application for providing commands to the image scanning apparatus for controlling the parameters, including at least one of: retrieving scan parameters, and manipulating scan parameters, and running a software interface on the scanning control apparatus for translating the external control commands into a command syntax and thence into the scanner control commands.

In accordance with an aspect of the invention, the step of running the software application comprises at least one of: (a) running the software application independently of any Application Programming Interface (API) of software running on the scanning control apparatus, (b) running the software application independently of an application running on a machine associated with the controlling parameters, (c) running the software without constraint of particular parameters for the external control commands and such that parameters of an open protocol can be manipulated, and (d) running the software without constraint of particular parameters for the external control commands and such that parameters of an open protocol can be manipulated.

In accordance with an aspect of the invention, a computer program product comprises a computer useable medium having computer program logic recorded thereon for program code for controlling parameters of an image scanning apparatus, comprising the steps of: translating commands from an external application for providing scanner control commands to a scanner control machine for control of the parameters; and utilizing syntax software for translating the commands from the external application into a given syntax for providing the scanner control commands.

BRIEF DESCRIPTION OF THE DRAWING

The invention will be more fully understood from the detailed description which follows, in conjunction with the Drawing, in which.

DETAILED DESCRIPTION OF THE INVENTION

The present invention is for an apparatus and system, and a method for remotely controlling, preferably in real time measurement parameters of a scanning apparatus, such as an MR scanner. Briefly, the present invention is for a method and system enabling remote control of all or a subset of available measurement parameters of an MR scanner by means of an external application running either on the MR scanner control machine or an external PC coupled to the MR scanner control machine typically by way of the hub of an internal scanner network.

The apparatus is realized in preferably a single software application and can receive commands from an external application or from external applications regarding the retrieval or manipulation of scan parameters; an external application herein is external to and independent of the MR software, that is, the software controlling the image scanning apparatus.

The apparatus uses a software interface which is generally part of the MR scanner control software to translate the received commands into a certain syntax which forms a part of the present invention into scanner control commands in accordance with an embodiment of the invention. After a transaction, the apparatus sends feedback to the requesting application. Thus, the apparatus or system of the present invention provides an interface for an application to modify a protocol on the MR scanner in a generic way.

In the description which follows, the invention is described, most conveniently and clearly, without loss of generality, by exemplary embodiments including the use of software code and/or pseudocode which is familiar and understood in the art to which it pertains, to describe and illustrate steps and functions of the invention.

Figure 1:
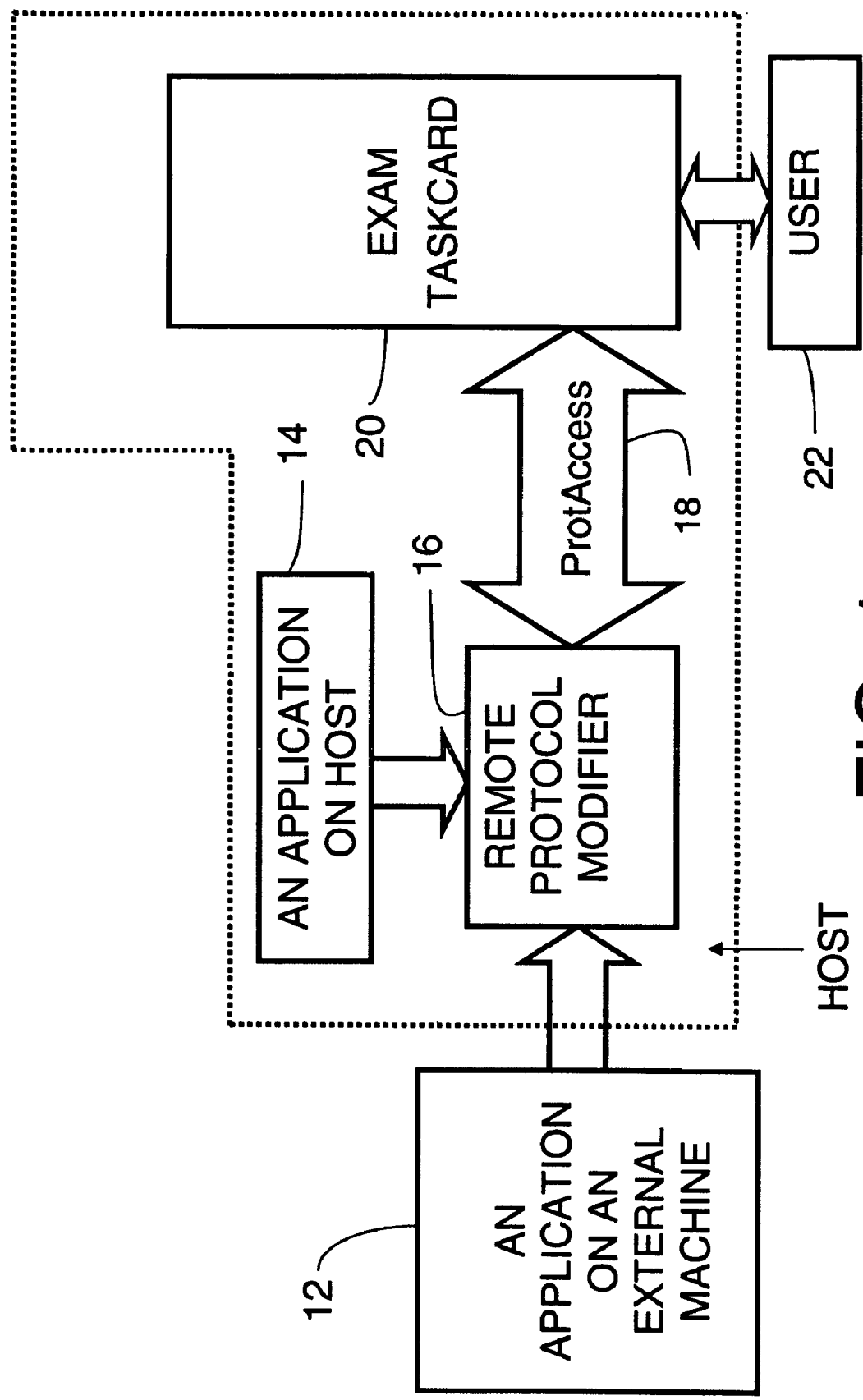
FIG. 1 shows data flow in a block schematic diagram of apparatus in accordance with the present invention.

Reference is made to FIG. 1 which shows data flow in a block schematic diagram of apparatus in accordance with the present invention. The "host system" HOST is shown enclosed within a dotted line and is associated with the machine controlling the image scanning apparatus (not shown). An examination task card 20 in the host system is associated with the MR Control Software controlling the image scanning apparatus to which it communicates parameters of the image scanning apparatus, including scanner control commands in the parameters. Examination task card 20 also communicates with a user 22.

Block 14 represents an external application running on the host system and communicating by way of a Remote Protocol Modifier 16. An external application 12 runs on an external machine in the same network as the host and communicates with the host system by way of Remote Protocol Modifier 16 which provides for data interchange over TCP/IP and which interchanges data with examination task card 20 by way of a link 18 (ProtAccess) providing access protocols for the data interchange. The implementation of ProtAccess link 18 in the described present embodiment comprises a User Interface as shown, for example, in FIG. 2, as will be further explained in reference to FIG. 2.

It is noted that application 12, application 14, Remote Protocol Modifier 16, and ProtAccess link 18 are identified as being particularly pertinent to illustrating modes of operation of the described embodiment of the present invention.

Briefly, the method of operation of an embodiment of the invention is as follows. In the embodiment of the present invention a method is provided for controlling parameters of an image scanning apparatus. The steps of the method comprise:

running an external software application for remotely controlling the parameters of an image scanning apparatus responsively to external control commands, the software application being run on at least one of:

(a) scanning control apparatus associated with the image scanning apparatus, and (b) a computer external to the image scanning apparatus coupled to the scanning control apparatus; and applying the external control commands to the software application for at least one of:

(c) retrieving scan parameters in the scanning control apparatus, and (d) manipulating the scan parameters.

In reference to FIG. 1, the foregoing will be explained in more detail, as follows.

The following definitions are applicable:

DEFINITIONS

Exam Task Card A higher level tab card that contains a User Interface to control an MR scanner Protocol A set of parameters controlling the MR measurement which is available on the MR scanner User Interface Online Protocol Protocol that is open on the exam task card Tab Card Logical set of user interface elements in the MR scanner's user interface Desired Functionality Steps of the desired functionality include:

Setting new values to the same parameters in the open online protocol which can be set by the user on the Exam Task Card Retrieving the values, range, unit and label of all parameters available on the Exam task card.

Buffer received data so that if it takes more time to set data in the protocol than to receive updates from the external application the apparatus should be able to process that data when it finishes its current parameter manipulation.

Figure 2:
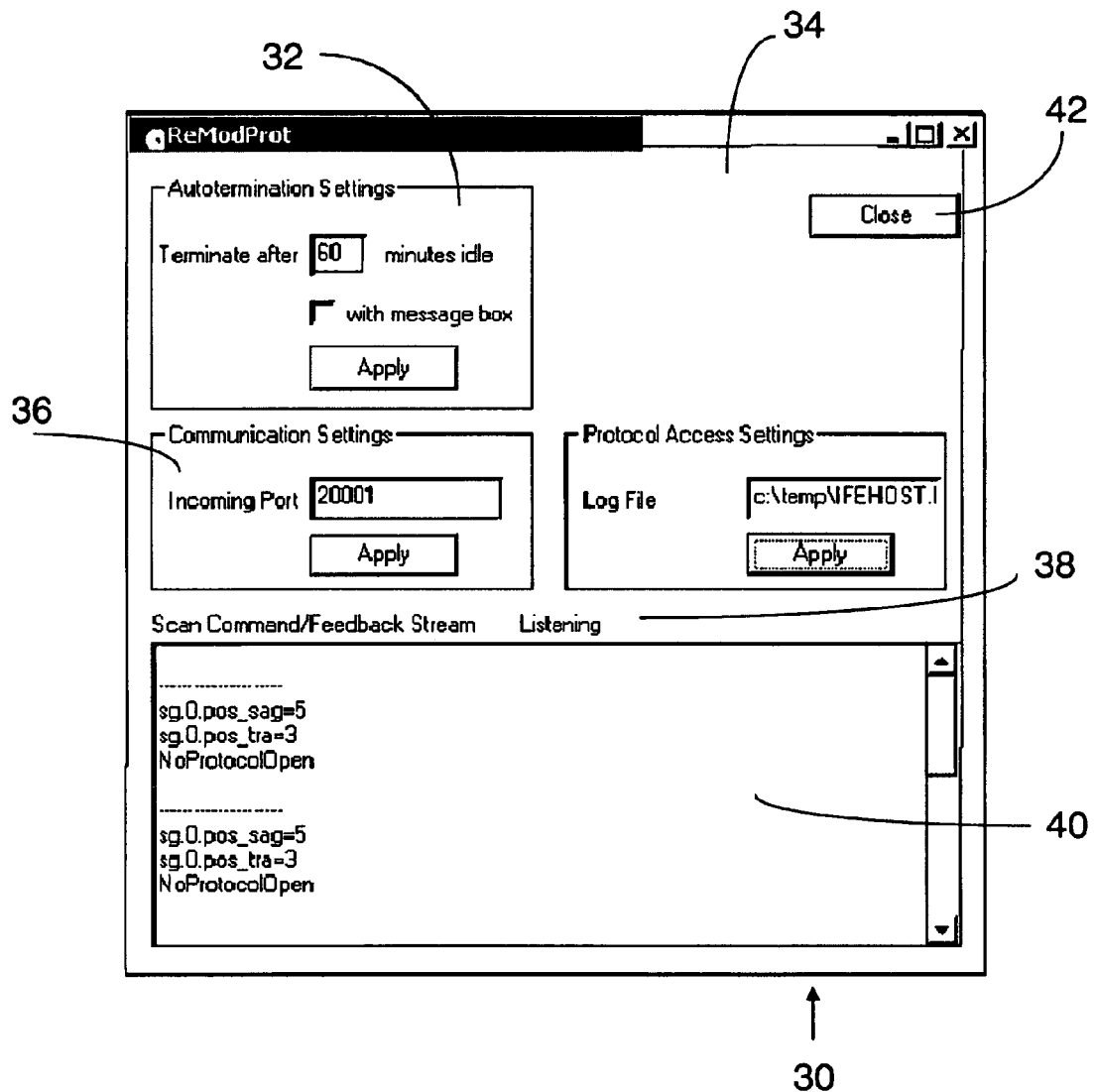
FIG. 2 shows a user interface of the implementation of a Remote Protocol Modifier in accordance with the present invention.

In further reference to FIG. 2, characteristics of the User Interface display 30 include, as shown by the respective section or panel labels on the display and as numbered in FIG. 2:

An Auto termination Settings section 32 which displays:

Minutes: idle Time after which ReModProt will auto Terminate; and a with message box: If the box is checked, the user will get a message box to confirm or cancel pending termination.

A Protocol Access Settings section 34 which shows:

Log File: being location of Log file, read only field;

The Apply button in Log File is not utilized in the present embodiment and is provided in the event a functionality is added where it may be needed.

A Communication Settings section 36 which shows:

the Incoming Port: Port Number, to which an external application sends data;

The Apply button is for applying port number changes.

A Connection Status section 38 shows possible values:

"Offline": no Connection available;

"Initializing": Connection is establishing;

"Listening": Waiting for data sent to ReModProt;

"Receiving": Receiving data over connection;

"Sending": Sending data over connection;

A Scan Command/Feedback Stream 40 shows a message window tracing all communication over the connection.

42 Close Button: on actuating,

Application closes, no data is saved

Software Interfaces

Characteristics of the software interfaces in the present exemplary embodiment include:

Numaris4: Protocol Software of the MR scanner control PC.

Communication with the External Application

Communication with the external application in the present exemplary embodiment is as follows:

The communication from the external application to the apparatus is realized with TCP/IP sockets. It is possible to change the port number during execution.

Syntax Checking for Open Online Protocol Comprises:

ReModProt expects the following string to be sent over the socket:

@? IsProtOpen
@

The following Table 1, describes the strings ReModProts is returning on the socket:

TABLE 1

Controlling protocol parameters

| | |
|---|---|
| @Prot_ok | Online Protocol is open and can be manipulated |
| @ | |
| @NoProtocolOpen | No online protocol is open |
| @ | |
| @ProblemOnHost | A problem within the internal host communication occurred (reason unknown, a restart might help) |
| @ | |
| @SocketTimeOut | Socket does not respond |
| @ | |

Retrieving and Setting Parameter Data

We distinguish between (a) a "set scenario" and (b) a "get scenario". (a) will set a value for a certain parameter into the open online protocol, (b) will retrieve the current value, all possible values and the parameter label from the open online protocol.

"Set Scenario" Syntax:
@
<name_tag1> = <value1>\n
<name_tag2>=<value2>\n
...
@
"Get Scenario" Syntax:
@
?<name_tag1>\n
<name_tag2>\n
...
@

For synchronization purposes '@' at the beginning and the end of a data stream is mandatory. In between an arbitrary number of parameters can be sent.

Each line must be separated with a line break "n"

White spaces are ignored

Case insensitive

Special Name Tag for Slice Orientation

A special Name Tag is provided for slice orientation, as follows:

The name_tag sg.0.ext_orientation is an exception. Using this name tag the orientation is in a more "reasonable" format for the external application. It substitutes the name tags sg.0.pe_dir, sg.0.ori_descr, sg.0.ori_alpha, sg.0.ori_beta, sg.0.rot.

Syntax:

sg.<sliceno>.ext_orientation=<x>/<y>/<z>/<a>\n

The four float values <x>,<y.>,<z> represent an axis of rotation followed by the angle <a> of right-handed rotation about that axis, in radians.

The rotation matrix given s=sin(a) c=cos(a) t=(1−cos(a)):

$$R = \begin{vmatrix} txx + c & txy + sz & txz - sy \\ txy - sz & tyy + c & tyz + sx \\ txz + sy & tyz - sx & tzz + c \end{vmatrix}$$

The reference for the rotation is a transversal plane in the patient LPH-coordinate system (left-posterior-head).

For example, a 90 degree rotation about the coronal axis is:

"sg.0.ext_orientation=0/1/0/1.5708\n"

The slice numbers are zero based.

Feedback of Protocol Operations

Feedback exists for each protocol parameter manipulation. This data is displayed in the Scan Command/Feedback Stream; see FIG. 2. In the "get scenario" this data is additionally sent over the socket to the external application using the following syntax:

@
<parameter_type>,<name_tag>,[<label>],<value>, [<value_range>]*\n . . . .
@

Table 2 shows the parameter types available:

TABLE 2

Parameter types available

| <parameter_type> | Values | Range |
|---|---|---|
| 0: Unknown Data type | | |
| 1: 4-Byte-Value | ==0 (FALSE) and ! = 0 (TRUE) | OFF (0), ON (1) |
| 2: 4-Byte-Value | −2,147,483,648 to 2,147,483,647 | [{min, inc, max},]* |
| 4: Byte-Value | null-terminated String | Cannot be set, just for retrieval |
| 5: Byte-Value | CurSel + null-terminated String-Array | Comma separated strings as options |

The following are Use cases

Set Parameter Data

External application modifies slice orientations of the $2^{nd}$ slice and some WIP-parameters.

Table 3 shows "Set parameter data" Use case

TABLE 3

"Set parameter data" Use case

| External application | ReModProt |
|---|---|
| EA sends the following string to the ReModProt port number on the host:<br>@<br>seq_wip7.0 = 121212<br>sg.1.ori_descr = 8<br>sg.1.ori_alpha = 25.2<br>sg.1.ori_beta = 5.7<br>sg.1.rot = 25.26<br>sg.1.pos_sag = 2.0<br>sg.1.pos_cor = 6.0<br>sg.1.pos_tra = 4.0<br>seq_res6 = 1<br>@ | Sets each parameter sequentially. Writes feedback from protocol into the status window in the UI. |

To set a value for an optional parameter the option number must be set and not the option string (e.g. sg.1.ori_descr=8 and NOT ori_descr=(T>C))

Get Parameter Data

External application wants to retrieve all slice information. Table 4 shows "Get parameter data" Use case.

TABLE 4

"Get parameter data" Use case

| External application | ReModProt |
|---|---|

EA sends the following string to the ReModProt port number on the host:
@
?sg
@

2,sg.0.size,Slices,1,(1,1,1)
    3,sg.0.df,Dist. factor,0,(−100,1,800)
    5,sg.0.pe_dir,Phase enc. dir.,A >> P,A >> P,R >> L
    5,sg.0.ori_descr,Orientation,Transversal,Sagittal,S > C,S > T,Coronal,C > T,C > S,Transversal,T > S,T > C
    3,sg.0.rot,Rotation,0.00,(−179.00,0.01,180.00)
    3,sg.0.pos_sag,L,5.0,(−999.0,0.1,999.0)
    3,sg.0.pos_cor,P,0.0,(−999.0,0.1,999.0)
    3,sg.0.pos_tra,H,8.0,(−999.0,0.1,999.0)

Figure 3:
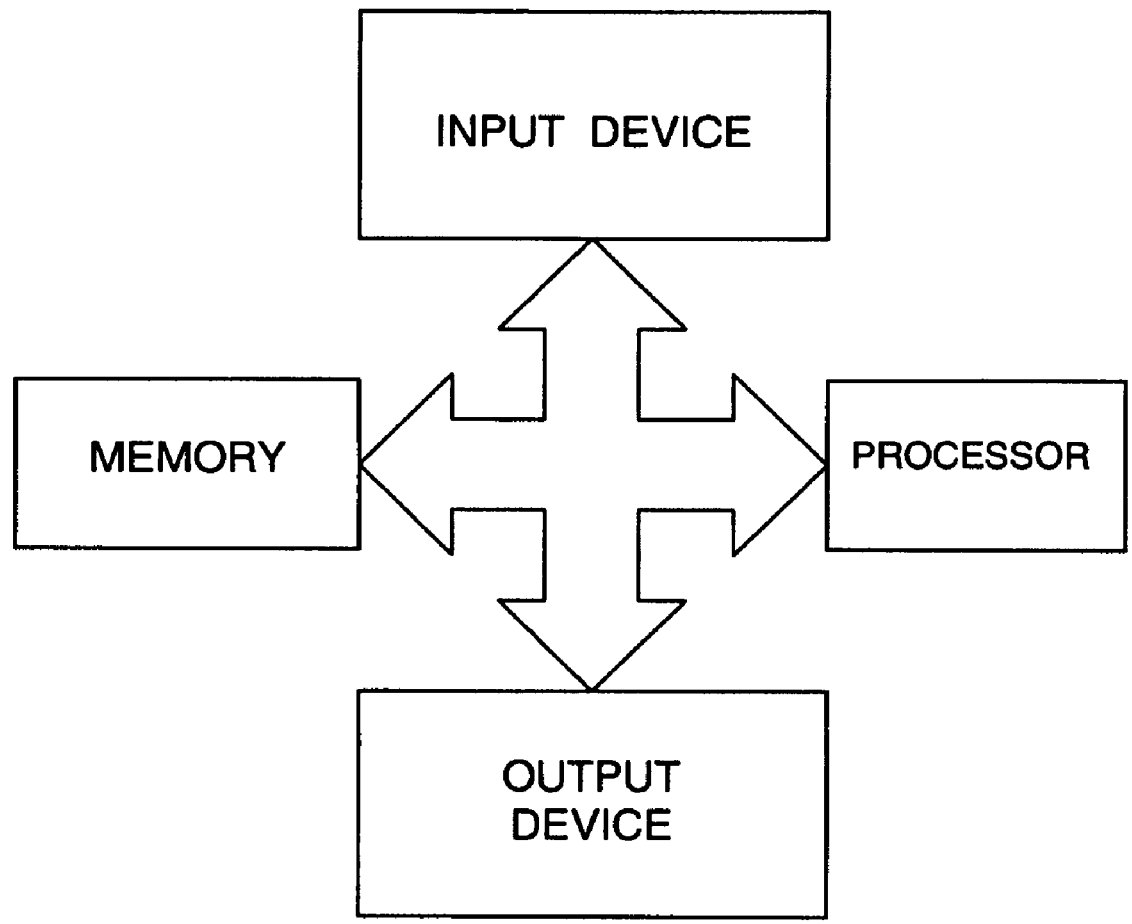
FIG. 3 shows in basic schematic form a digital processor as may be used in embodiments of the present invention.

As will be apparent, the present invention for an apparatus and method for remotely controlling in real time measurement parameters of, for example, a magnetic resonance (MR) scanner is best intended to be implemented with the use and application of imaging equipment in conjunction with a programmed digital computer. FIG. 3 shows in general terms and in basic schematic form a digital processor coupled for two way data communication with an input device, an output device, and a memory device for storing a program and other data. The input device is so designated in broad terms as a device for exchanging data, for example, relating to an image or images, or commands for processing in accordance with the present invention. For example, an input may be from an imaging device, such as a device incorporated in a CATSCAN, X-ray machine, an MRI or other device, or a stored image, or by communication with another computer or device by way of direct connection, a modulated infrared beam, radio, land line, facsimile, or satellite as, for example, by way of the World Wide Web or Internet, or any other appropriate source of such data. The output device may be for data, commands, and/or it may include a computer type display device using any suitable apparatus such as a cathode-ray kinescope tube, a plasma display, liquid crystal display, and so forth, and serve as a user interface as utilized in the described exemplary embodiment, or it may or may not include a device for rendering an image and may include a memory device or part of the memory device of FIG. 3 for storing an image, or measurement parameters or commands for further processing, or for viewing, or evaluation, as may be convenient, or it may utilize a connection or coupling including such as are noted above in relation to the input device. The processor is operative with a program set up in accordance with the present invention for implementing steps of the invention. Such a programmed computer may interface readily through communications media such as land line, radio, the Internet, and so forth for image data acquisition and transmission.

The invention may be readily implemented, at least in part, in a software memory device and packaged in that form as a software product. This can be in the form of a computer program product comprising a computer useable medium having computer program logic recorded thereon for program code for performing the method of the present invention.

The present invention has also been explained in part by way of examples using illustrative exemplary embodiments. It will be understood that the description by way of exemplary embodiments is not intended to be limiting and that, while the present invention is broadly applicable, it is helpful to also illustrate its principles, without loss of generality, by way of exemplary embodiments relating to an important field of application for the present invention, namely, to computer vision and imaging. For example, the described embodiments typically illustrate operation in real time, this being generally the preferred mode of operation.

It will also be understood that various changes and substitutions not necessarily herein explicitly described may be made without departing from the spirit and scope of the invention which is defined by the claims following.

What is claimed is:

1. Apparatus configured for remotely controlling real-time measurement operating parameters of a medical image scanner, said apparatus comprising:

a non-transitory software interface implementing an open protocol that translates commands received from a non-transitory external software application that provides medical image scanner control commands to a scanner control machine that control said operating parameters, wherein said external software application runs on an external machine, said external machine is remotely located with respect to the scanner control machine, and said external machine and said scanner control machine being nodes of geographically separate local area networks coupled via a wide area network or the Internet;

said software interface comprising a remote protocol modifier that manipulates available operating parameters of an open protocol over the wide area network or the Internet in real time;

said software interface comprising syntax software that translates said scanner control commands from said external software application into a given syntax that provides said scanner control commands to said scanner control machine, in real time, whereby a user of the external software application remotely controls the geographically separate medical image scanner and the real-time measurement operating parameters via the wide area network or the Internet.

2. Apparatus is recited in claim 1, wherein said software interface comprises a user interface and provides at least one of functionalities listed as follows:

setting new respective values for said real-time measurement operating parameters, which are otherwise settable by a task card user, retrieving values, range, unit, and labels available on a task card, and buffering received data such that, when more time is required to set data in a protocol of said interface than is required to receive updates from said external software application, then processing said data after completing a current manipulation.

3. Apparatus as recited in claim 1, wherein said scanner control machine includes scanner control software that provide said scanner control commands that control said measurement operating parameters of said medical image scanner in real time.

4. Apparatus as recited in claim 3, comprising in any combination, at least one of the functionalities listed as follows:
- modifying a protocol on said scanner control software,
- said scanner control commands retrieving said operating parameters,
- sending feedback to a requesting application following a transaction,
- said scanner control commands manipulating said operating parameters in real-time,
- including a special Name Tag for image slice orientation, utilizing a rotation matrix operation, and
- enabling generic modification by said external application of a protocol on said medical image scanner.

5. Apparatus as recited in claim 1, wherein said medical image scanner comprises a magnetic resonance (MR) image scanning apparatus.

6. Apparatus configured for remotely controlling real-time measurement operating parameters of a medical image scanning apparatus, said apparatus comprising:
- a scanner control machine that controls said operating parameters, wherein said scanner control machine includes a non-transitory scanner control software that provides scanner control commands;
- wherein an interface of said scanner control software comprise a remote protocol modifier that manipulates available operating parameters of an open protocol in real-time and;
- syntax software that translates said scanner control commands received from an external software application into a given syntax that provides said scanner control commands; and
- an external machine that runs said external software application that provides scanner control commands to said scanner control machine
- wherein said external machine is remotely located with respect to the scanner control machine, said external machine and said scanner control machine are nodes of geographically separate local area networks and said external machine is coupled to said remote protocol modifier via a wide area network or the Internet in real time,
- whereby a user of the external software application remotely controls the geographically separate medical image scanner and the real-time measurement operating parameters via the wide area network or the Internet.

7. Apparatus as recited in claim 6, wherein said medical image scanning apparatus is a magnetic resonance (MR) image scanning apparatus.

8. Apparatus configured for remotely controlling real-time measurement operating parameters of a medical image scanning apparatus that includes a scanner control machine comprising software that provides said operating parameters, said apparatus comprising:
- memory that stores a non-transitory program and other data; and
- a processor in communication with said memory that is operative with said non-transitory program to provide:
  - a non-transitory software interface implementing an open protocol that translates commands received from an external software application running on an external machine that provide scanner control commands to said scanner control machine that control said real-time measurement operating parameters, wherein said external software application runs on an external machine, said external machine is remotely located with respect to the scanner control machine, said external machine and said scanner control machine are nodes of geographically separate local area networks coupled via a wide area network or the Internet in real time,
  - wherein said software interface comprises a remote protocol modifier that manipulates available real-time measurement operating parameters of said open protocol, in real time
  - and syntax software that translates said commands received from said external software application into a given syntax that provide scanner control commands, and to
  - supply said scanner control commands to non-transitory scanner control software in said scanner control machine that control said operating parameters in real time,
  - whereby a user of the external software application remotely controls the geographically separate medical image scanner and the real-time measurement operating parameters via the wide area network or the Internet.

9. Apparatus as recited in claim 8, wherein said medical image scanning apparatus is a magnetic resonance (MR) image scanning apparatus.

10. A method for remotely controlling real-time measurement operating parameters of a medical image scanning apparatus that includes a scanner control machine having scanner control software, said method comprising:
- processing, in a non-transitory software interface including a user interface, commands received from a non-transitory external software application using an open protocol, wherein said external software application runs on an external machine, said external machine is remotely located with respect to the scanner control machine, said external machine and said scanner control machine are nodes of geographically separate local area networks coupled via a wide area network or the Internet, said processing comprising:
  - translating commands in said software interface received from said external software application that provide scanner control commands to a said scanner control machine that control said real-time measurement operating parameters;
  - manipulating available real-time measurement operating parameters of said open protocol associated with said scanner control commands in a remote protocol modifier comprised in said software interface in real time;
  - said software interface comprising syntax software that translates said commands received from said external software application into a given syntax that provide said scanner control commands in real-time,
  - whereby a user of the external software application remotely controls the geographically separate medical image scanner and the real-time measurement operating parameters via the wide area network or the Internet.

11. A method as recited in claim 10, comprising performing at least one of:
- setting new respective values for said the real-time measurement operating parameters, which are otherwise settable by a task card user;
- retrieving values, range, unit, and labels available on a task card;
- sending feedback to a requesting application following a transaction;
- modifying a protocol on said scanner control software;

retrieving available the real-time measurement operating parameters of said medical image scanning apparatus;

manipulating available the real-time measurement operating parameters of said medical image scanning apparatus;

setting new values to the same the real-time measurement operating parameters in an open online protocol as can be set by a user on an exam task card;

retrieving values, range, unit and label of all the real-time measurement operating parameters available on said exam task card; and buffering received data such that, when more time is required to set data in a protocol of said interface unit than is required to receive updates from said external application, then processing said data after completing a current manipulation.

12. A method as recited in claim 10, wherein said medical image scanning apparatus is a magnetic resonance (MR) image scanning apparatus.

13. A method for remotely controlling in real-time a medical image scanning apparatus, said method comprising:

running a non-transitory software application on an external computer remotely located with respect to said medical image scanning apparatus, wherein said software application remotely controls real-time measurement operating parameters and scanner control commands, of said medical image scanning apparatus:

applying external control commands from said software application to a scanning control apparatus associated with said medical image scanning apparatus using an open protocol that provides scanner control commands to said scanning control apparatus that control said real-time measurement operating parameters, including at least one of:

retrieving scan real-time measurement operating parameters, and manipulating scan real-time measurement operating parameters, manipulating available real-time measurement operating parameters of an open protocol, including an open online protocol, in a remote protocol modifier comprised in said software application, and running a non-transitory software interface on said scanning control apparatus that translates said external control commands into a command syntax and thence into said scanner control commands in real time, wherein said external computer and said image scanning apparatus are nodes of geographically separate local area networks coupled via a wide area network or the Internet, whereby a user of the external software application remotely controls the geographically separate medical image scanner and the real-time measurement operating parameters via the wide area network or the Internet.

14. A method as recited in claim 13, wherein said step of running said software application comprises running said software without constraint of particular real-time measurement operating parameters for said external control commands such that said real-time measurement operating parameters of said open protocol can be manipulated.

15. A method as recited in claim 13, wherein said medical image scanning apparatus is a magnetic resonance (MR) image scanning apparatus.

16. A non-transitory program storage device readable by a computer, tangibly embodying a program of instructions executed by the computer to perform the method steps for remotely controlling real-time measurement operating parameters of a medical image scanning apparatus that includes a scanner control machine having scanner control software, said method comprising the steps of:

processing, in a non-transitory software interface including a user interface, commands received from an external software application using an open protocol, wherein said external software application runs on an external machine, said external machine is remotely located with respect to the scanner control machine, said external machine and said scanner control machine being nodes of geographically separate local area networks coupled via a wide area network or the Internet, said processing comprising:

translating commands in said non-transitory software interface received from said external software application that provide scanner control commands to a scanner control machine that control said real-time measurement operating parameters;

manipulating available real-time measurement operating parameters of said open protocol associated with said scanner control commands in a remote protocol modifier comprised in said software interface in real time;

and said non-transitory software interface comprising syntax software that translates said commands received from said external software application into a given syntax that provide said scanner control commands in real time, whereby a user of the external software application remotely controls the geographically separate medical image scanner and the real-time measurement operating parameters via the wide area network or the Internet.

17. The non-transitory computer readable program storage device of claim 16, wherein said medical image scanning apparatus is a magnetic resonance (MR) image scanning apparatus.

* * * * *